US012352303B2

United States Patent
Lan

(10) Patent No.: US 12,352,303 B2
(45) Date of Patent: *Jul. 8, 2025

(54) FIXING ELEMENT AND HEAT DISSIPATION UNIT USING SAME

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 240 days.

This patent is subject to a terminal disclaimer.

(21) Appl. No.: 18/202,958

(22) Filed: May 29, 2023

(65) Prior Publication Data

US 2024/0401633 A1     Dec. 5, 2024

(51) Int. Cl.
*F16B 41/00*     (2006.01)
*F16B 39/10*     (2006.01)
*H05K 7/20*     (2006.01)

(52) U.S. Cl.
CPC ............ *F16B 39/10* (2013.01); *F16B 41/002* (2013.01); *H05K 7/2039* (2013.01)

(58) Field of Classification Search
CPC .... F16B 41/002; F16B 21/186; F16F 2226/04
USPC .......................................... 411/352, 353, 999
See application file for complete search history.

(56) References Cited

U.S. PATENT DOCUMENTS

| 2,831,520 | A | * | 4/1958 | Clarke | F16B 5/0208 |
| | | | | | 292/251 |
| 2,967,557 | A | * | 1/1961 | Tait | F16B 5/0208 |
| | | | | | 411/999 |
| 3,343,581 | A | * | 9/1967 | Martin | F16B 5/0208 |
| | | | | | 292/251 |
| 3,415,302 | A | * | 12/1968 | Beck | F16B 37/044 |
| | | | | | 411/350 |

(Continued)

FOREIGN PATENT DOCUMENTS

| CN | 101039564 A | 9/2007 |
| CN | 211017061 U | 7/2020 |

(Continued)

OTHER PUBLICATIONS

Search Report dated Mar. 4, 2024 issued by Taiwan Intellectual Property Office for counterpart application No. 112117159.

*Primary Examiner* — Flemming Saether
(74) *Attorney, Agent, or Firm* — Demian K. Jackson; Jackson IPG PLLC

(57) ABSTRACT

A heat dissipation unit includes a main body and a plurality of fixing elements. The main body has a heat receiving zone and a plurality of through holes formed at four corners outside the heat receiving zone. The fixing elements are mounted in the through holes and respectively include a screw having a spring fitted thereon; a sleeve disposed outside the screw and the spring and having a pair of windows formed near an upper end; and a spring retaining ring fitted around the sleeve and having a pair of upward extended hooked arms extended through the windows to (Continued)

compress the spring in the sleeve. When the fixing elements have been assembled to the main body, the springs can be released at the same time and can therefore apply even downward forces synchronously for the main body to closely and evenly contact with a bare die heat source.

9 Claims, 6 Drawing Sheets

(56) References Cited

U.S. PATENT DOCUMENTS

| | | | | |
|---|---|---|---|---|
| 5,836,429 | A * | 11/1998 | McGuire | F16D 65/091 |
| | | | | 188/78 |
| 6,468,011 | B2 * | 10/2002 | Mayer | F16B 21/18 |
| | | | | 411/153 |
| 6,955,512 | B2 * | 10/2005 | Allen | H05K 7/14 |
| | | | | 211/26 |
| 7,333,340 | B2 * | 2/2008 | Zhang | F28D 15/0233 |
| | | | | 361/719 |
| 7,606,032 | B2 * | 10/2009 | Lin | F16B 35/041 |
| | | | | 361/709 |
| 8,511,956 | B2 * | 8/2013 | Liu | H01L 23/4006 |
| | | | | 411/107 |
| 2012/0195711 | A1 | 8/2012 | Chiu | |
| 2024/0402766 | A1 * | 12/2024 | Lan | G06F 1/183 |
| 2024/0402769 | A1 * | 12/2024 | Lan | G06F 1/183 |

FOREIGN PATENT DOCUMENTS

| | | |
|---|---|---|
| CN | 211951083 U | 11/2020 |
| TW | M645710 U | 9/2023 |

* cited by examiner

FIXING ELEMENT AND HEAT DISSIPATION UNIT USING SAME

FIELD OF THE INVENTION

The present invention relates to a fixing element, and more particularly, to a fixing element, a plurality of which can be operated at the same time to elastically release springs thereof, so that the springs apply even downward forces synchronously to push a heat dissipation main body against a bare die heat source without causing damaged to the heat source or producing thermal resistance between the heat dissipation main body and the heat source due to asynchronously and unevenly applied forces. The present invention also relates to a heat dissipation unit that uses the fixing elements of the present invention.

BACKGROUND OF THE INVENTION

Nowadays, high performance and high power chips are used in electronic devices for the latter to provide highly enhanced computing power. The chip in processing data will produce a relatively high amount of heat to form a heat source. Conventionally, the chip is packaged or encapsulated to avoid the chip from being damaged. With the enhanced computing power thereof, the chip in processing data produces even more heat than ever before. However, the package of the chip adversely affects the produced heat from efficiently dissipating into outer environment. Therefore, many currently available chips are provided in the form of bare dies without any package to protect their surfaces. The non-packaged bare die has a non-smooth and convex surface and accordingly, has a relatively small and weak contact area between it and a heat dissipation device for heat exchange. Thus, the bare die is subjected to damage and breaking when the heat dissipation device is connected thereto.

Conventionally, to fix the heat dissipation device to the base carrying the bare die heat source, screws are sequentially tightened to screw fastening points one by one. Since the screws are not tightened synchronously, the heat dissipation device connected to the base tends to be skewed relative to the heat source to apply uneven forces to the heat source, and the bare die subjected to the unevenly distributed forces is easily broken and damaged.

Please refer to FIGS. 1 and 2, which show a conventional manner of fixing a heat dissipation device C to a heat source A in the form of a bare die. As shown, the bare die A is placed on a base D. Four corners of the base D correspondingly located outside the heat source A are provided with an internally threaded copper sleeve rod B each. The heat dissipation device C also has four holes C3 formed corresponding to the four copper sleeve rods B for a screw unit C1 to extend through each of the holes C3. Each of the screw units C1 has a spring C2 fitted therearound. To lay the heat dissipation device C to the top of the heat source A, the screw units C1 are sequentially threaded through the holes C3 into corresponding copper sleeve rods B one by one with a power screwdriver handled manually or by a mechanical arm. To shorten the fixing time on a production line and complete the fixing operation within a limited time period, each of the screw units C1 is fully tightened in one movement at a very quick speed. As soon as the screw unit C1 is fully tightened, the spring C2 fitted therearound is also compressed in a direction toward the heat source A. The screw units C1 individually tightened at a quick speed and the springs C2 quickly compressed toward the heat source A tend to result in uneven and asynchronous distribution of downward forces over four corners of the base D and accordingly the heat source A. And, the heat source A, i.e. the bare die, being fragile and breakable, is easily damaged under uneven force application thereto.

The bare die is so fragile that even downward forces must be synchronously applied by the heat dissipation device to the four corners of the base carrying the bare die to ensure successful fixing of the heat dissipation device to the top of the bare die. In the event the four corners of the base are subjected to unevenly and asynchronously applied forces from the heat dissipation device, warp of the bare die or the heat dissipation device might occur to cause incomplete contact and thermal resistance between the two parts. In some worse conditions, the warped bare die might become damaged and non-usable and the thermal resistance might lead to uneven heat distribution over or inactive heat conduction of the heat dissipation device.

It is therefore tried by the inventor to find a fixing element that enables the heat dissipation device to apply even and synchronous forces to the heat source to ensure full and close contact between them, maintains a proper binding force between the bare die and the heat dissipation device, and is repeatedly adjustable for reuse.

SUMMARY OF THE INVENTION

To effectively solve the above problems, a primary object of the present invention is to provide a fixing element, a plurality of which can be operated at the same time to elastically release springs thereof, so that the springs apply even downward forces synchronously to push a heat dissipation main body against a bare die heat source to avoid broken or collapsed edges of the heat source as would occur in the prior art where the fixing elements are tightened one by one to produce uneven downward forces toward the bare die heat source.

The fixing elements respectively include a screw, a sleeve, and a spring retaining ring.

The screw has a spring fitted thereon and includes a retaining ring located above an externally threaded lower end of the screw. The spring has a bottom end pressed against the retaining ring and is prevented by the retaining ring from excessively moving axially downward to separate from the screw.

The sleeve has open upper and lower ends, and a hollow receiving space defined in the sleeve between the upper and the lower end. The sleeve is provided near the upper end with a pair of windows, which are communicable with the receiving space. An area on an outer surface of the sleeve extended from lower edges of the windows to the lower end of the sleeve is defined as a coupling zone. And the screw and the spring fitted thereon are located in the hollow receiving space of the sleeve.

The spring retaining ring defines an inner opening for fitting on around the coupling zone of the sleeve. The spring retaining ring includes an upward hooked arm set consisting of a plurality of hooked arms, which are correspondingly extended through the windows into the hollow receiving space of the sleeve to press on a top end of the spring, so that the spring is held down in the sleeve in a compressed state.

When the spring retaining ring is subjected to a downward external pressure, the hooked arm set is forced to elastically expand radially outward, bringing the hooked arms to move out of the windows and no longer press against the top end of the spring, allowing the spring to release its elastic force.

Another object of the present invention is to provide a heat dissipation unit that is connected to a bare die heat source using the above described fixing elements. The heat dissipation unit includes a heat dissipation main body and a plurality of fixing elements.

The heat dissipation main body has a first side, an opposite second side, a heat receiving zone, and a plurality of through holes formed at four corners outside the heat receiving zone to extend from the first side to the second side of the heat dissipation main body. The fixing elements are correspondingly mounted in the through holes.

To connect the heat dissipation main body to the bare die heat source, first align the heat receiving zone on the heat dissipation main body with the bare die heat source. Then, the externally threaded lower ends of the fixing elements are preliminarily screwed to a base carrying the bare die heat source thereon. At this point, the springs are still compressed in the sleeve. When all the fixing elements have been preliminarily screwed to the four corners outside the heat receiving zone, an external pressure is applied to all the spring retaining rings at the same time. The hooked arms subjected to the pressure are caused to move away from the top ends of the springs and no longer press against the latter, allowing the springs to apply even downward forces to the four corners outside the heat receiving zone on the heat dissipation main body synchronously, so that the heat dissipation main body can be stably moved downward to closely contact with the bare die heat source. In this manner, it is able to avoid the situation of broken or collapsed edges of the heat source due to uneven forces applied thereto or the occurrence of thermal resistance due to incomplete contact of the heat dissipation main body with the heat source. Further, it is also able to avoid the damaged bare die heat source caused by excessive downward pressure in the process of tightening the fixing elements to the through holes on the heat dissipation main body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with a preferred embodiment thereof.

Figure 1:
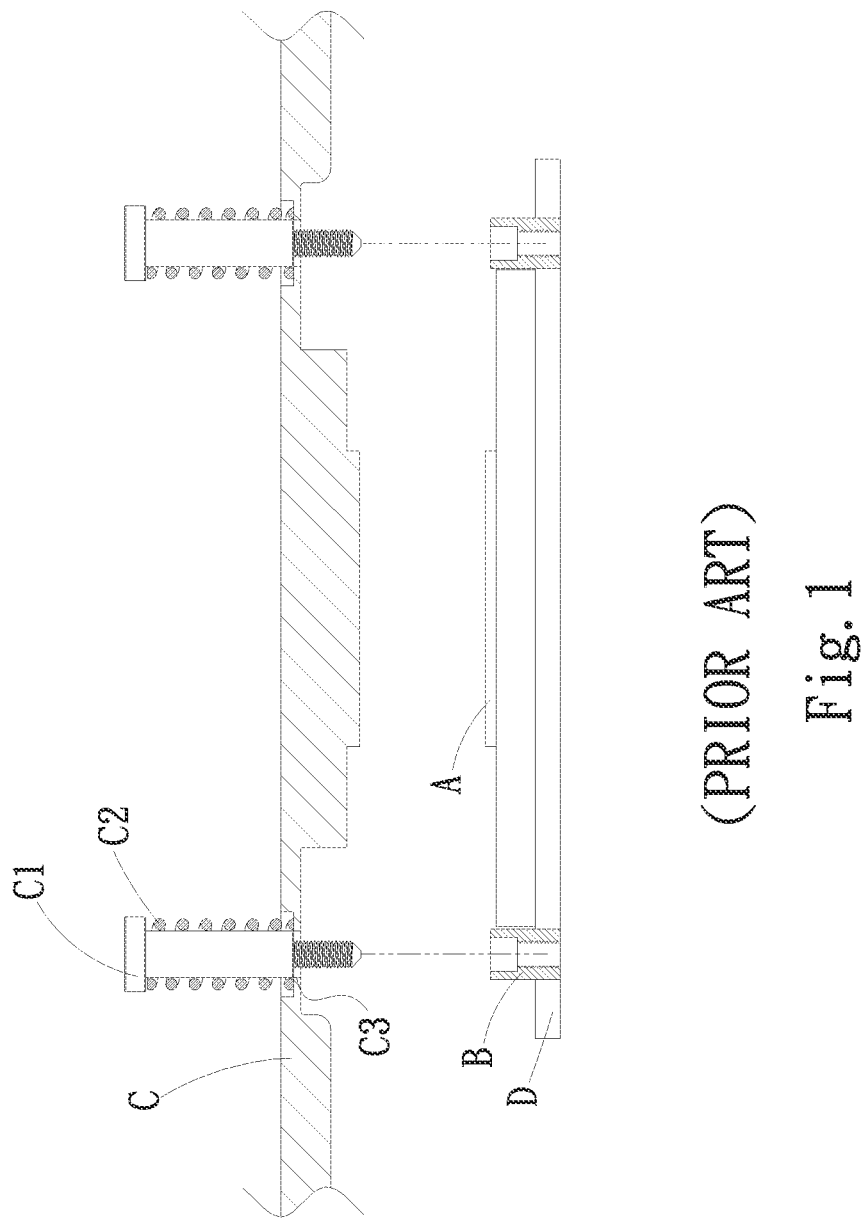
FIG. 1 shows how a heat dissipation device is connected to a bare die heat source in the prior art.
Figure 2:
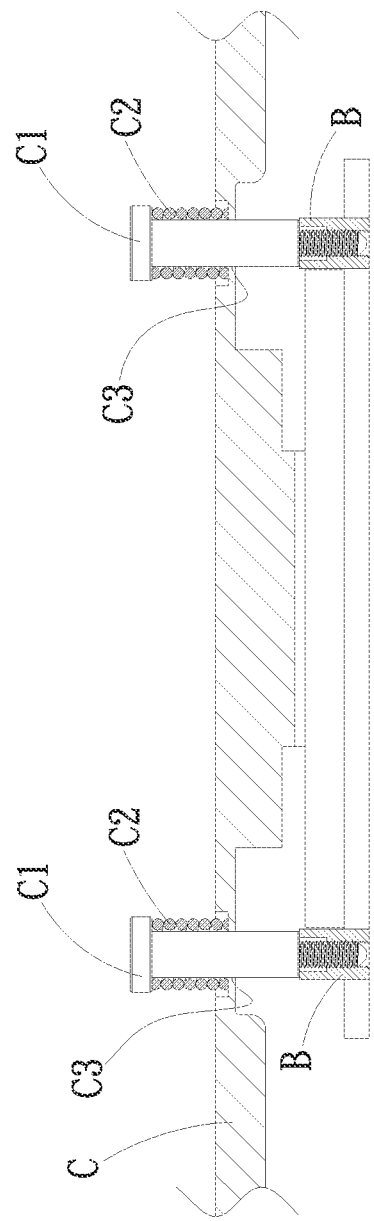
FIG. 2 shows the heat dissipation device and the bare die heat source of FIG. 1 after being connected to each other.
Figure 3:
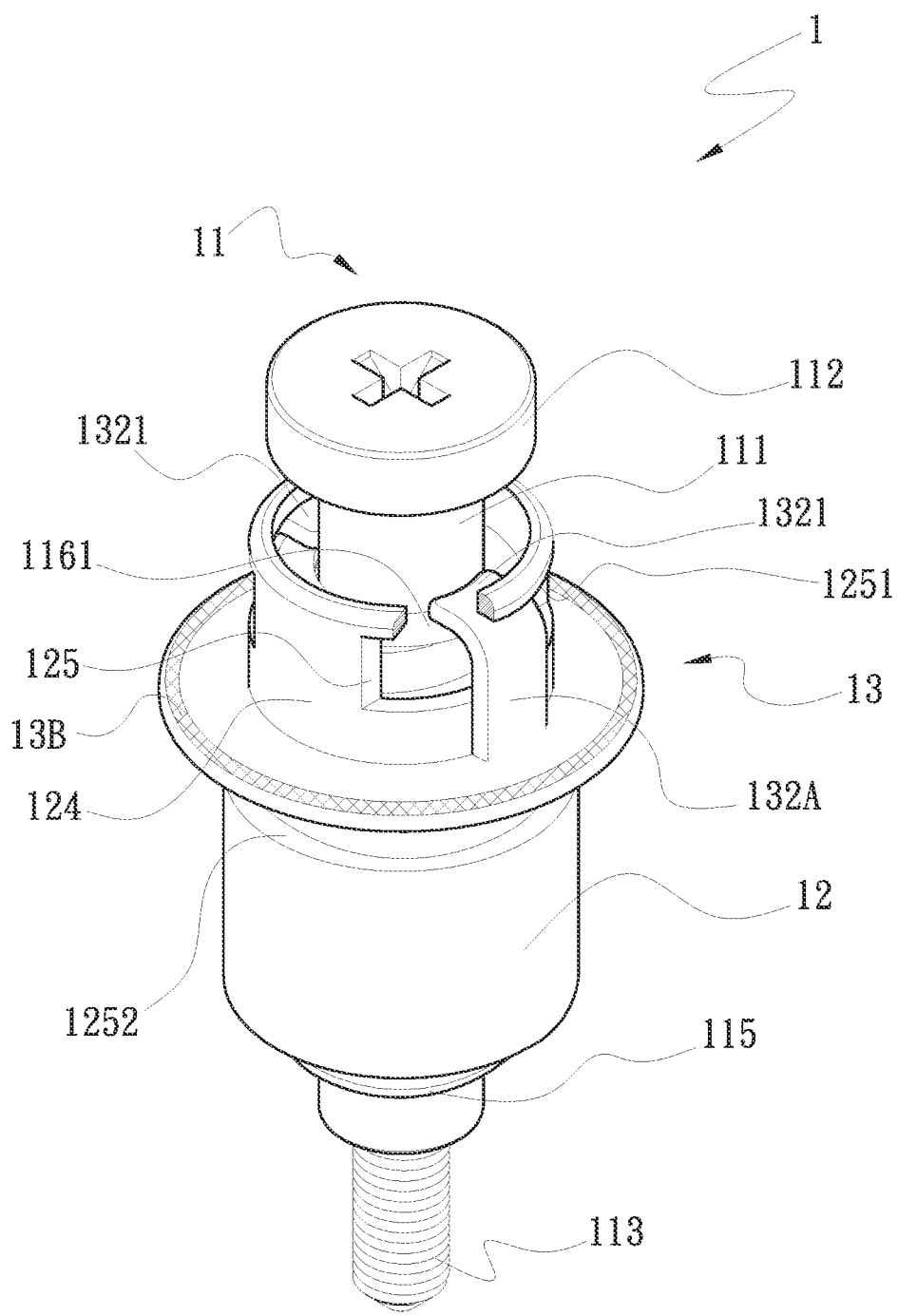
FIG. 3 is an assembled perspective view of a fixing element according to a preferred embodiment of the present invention.
Figure 4:
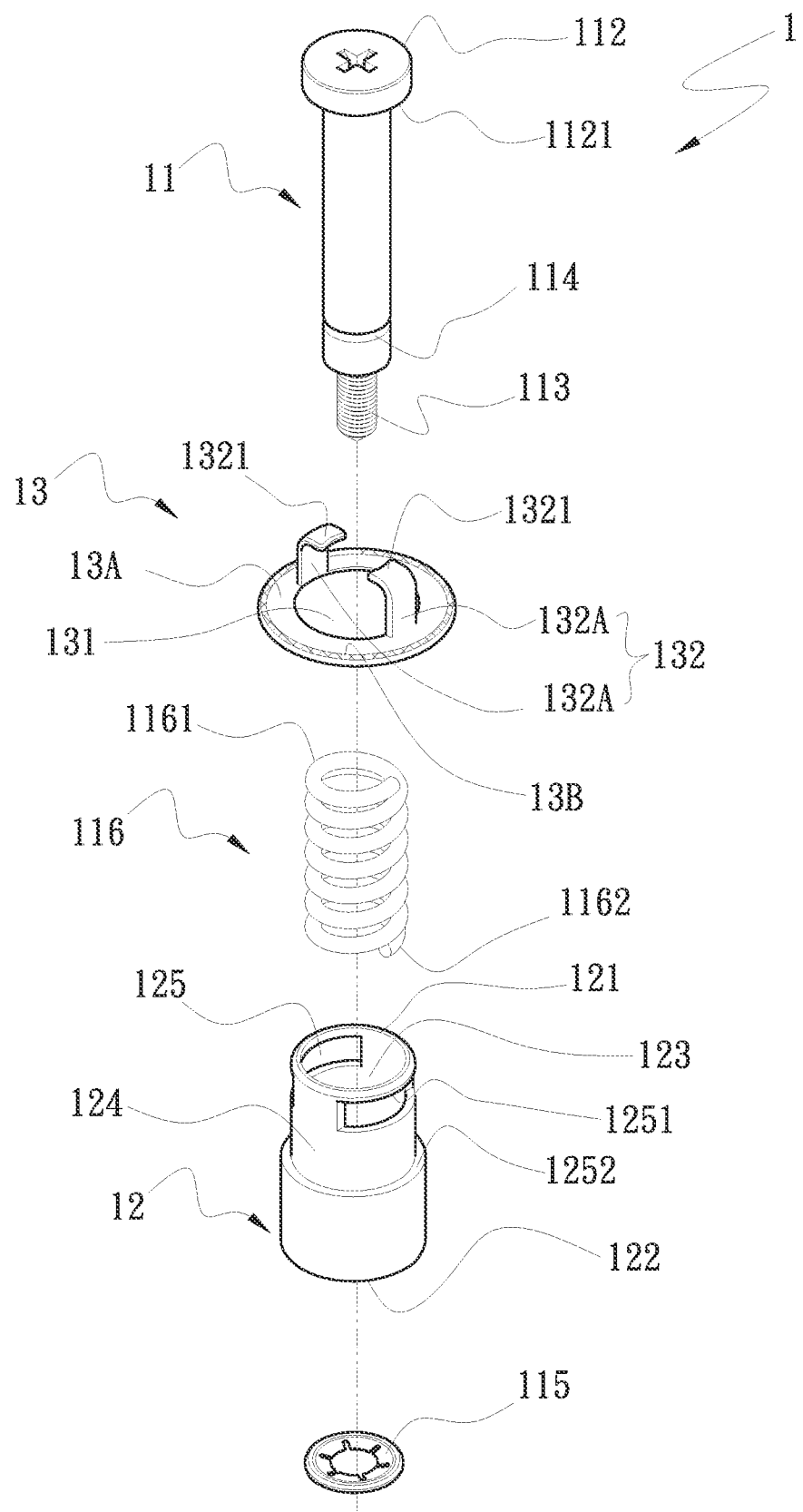
FIG. 4 is an exploded view of FIG. 3.
Figure 5:
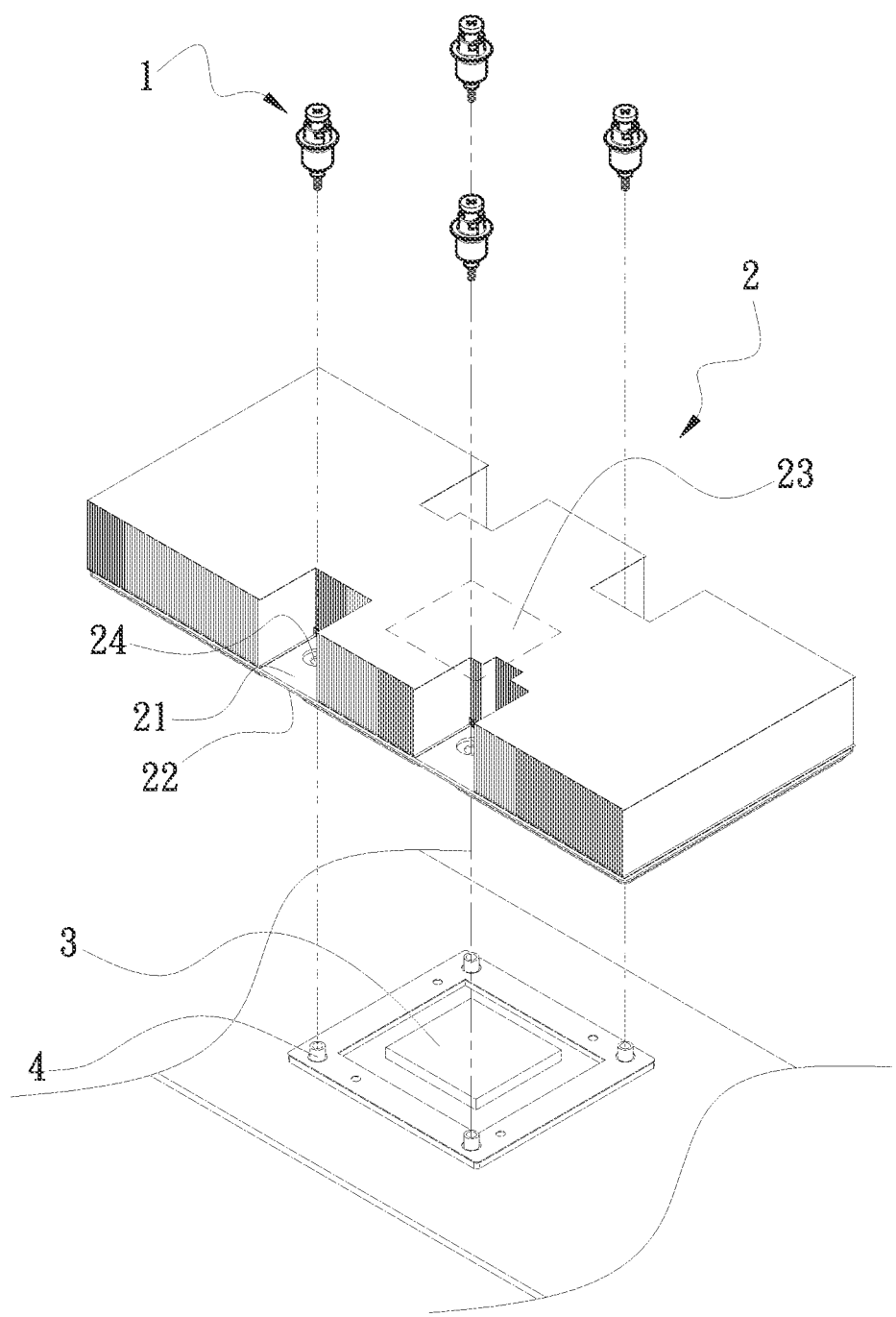
FIG. 5 is an exploded perspective view showing a heat dissipation unit of the present invention for connecting to a heat source.
Figure 6:
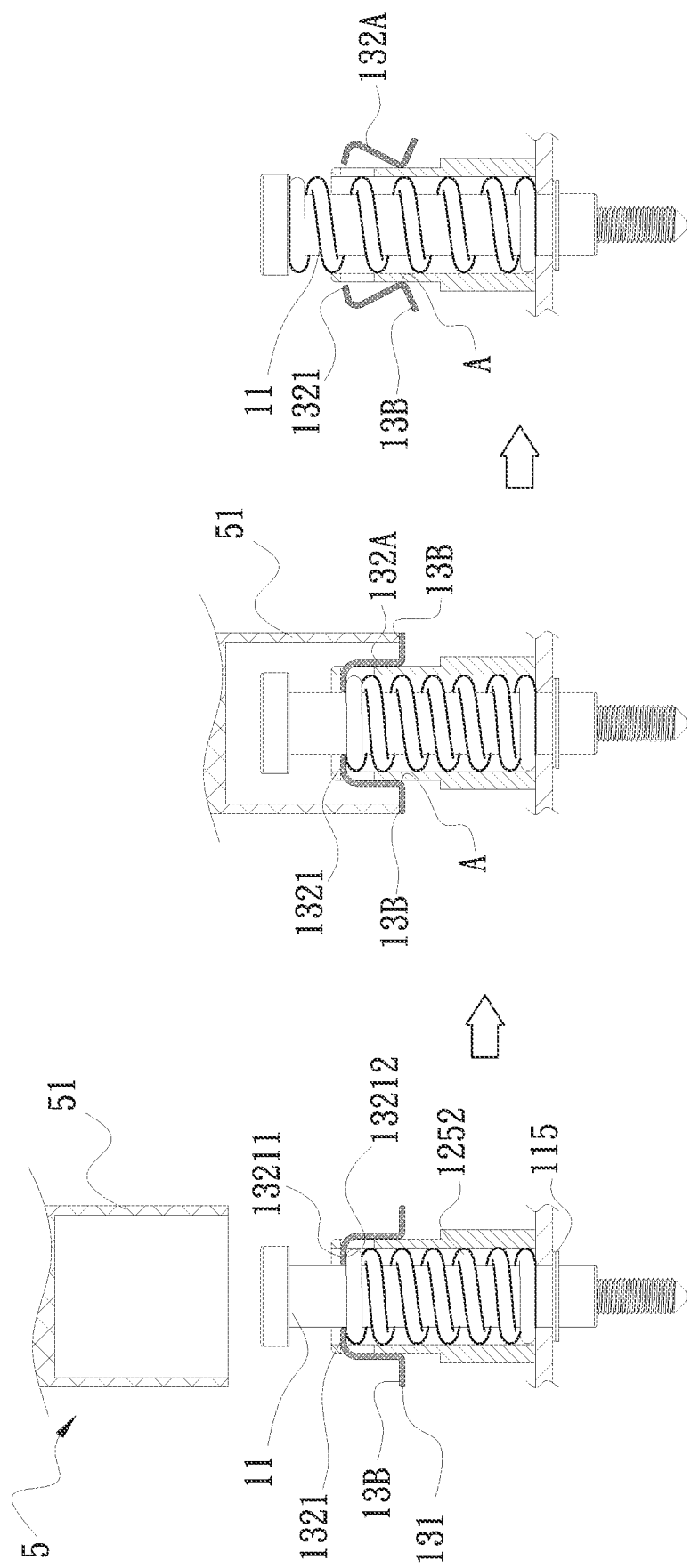
FIG. 6 includes sectional side views illustrating how the fixing element of the present invention is driven to work.

Please refer to FIGS. 3 to 6, wherein FIGS. 3 and 4 are assembled and exploded perspective views, respectively, of a fixing element 1 according to a preferred embodiment of the present invention for connecting a heat dissipation unit to a bare die heat source 3; FIG. 5 is an exploded perspective view of the heat dissipation unit of the present invention to be connected to a bare die heat source 3; and FIG. 6 includes sectional side views illustrating how the fixing element 1 of the present invention is driven to work. As shown, the fixing element 1 according to the present invention includes a screw 11, a sleeve 12, and a spring retaining ring 13.

The screw 11 has a spring 116 fitted thereon and includes a screw head 112 and a plurality of male threads 113 formed on two opposite ends thereof, and an annular groove 114 formed around the screw 11 closely above the male threads 113 for a retaining ring 115 to set therein. The retaining ring 115 may be a C-ring or an E-ring. The spring 116 has a top end 1161 and a bottom end 1162, and is fitted on the screw 116 between the screw head 112 and the retaining ring 115 with the bottom end 1162 elastically pressed against the retaining ring 115.

The sleeve 12 includes an open upper end 121, an open lower end 122, and a hollow receiving space 123 defined between and communicable with the upper and the lower end 121, 122. The sleeve 12 is provided near the upper end 121 with a pair of windows 125, which is communicable with the receiving space 123. An area on an outer surface of the sleeve 12 between lower edges of the windows 125 and the lower end 122 of the sleeve 12 is defined as a coupling zone 124. The coupling zone 124 of the sleeve 12 may have an outer diameter larger than, smaller than, or equal to the outer diameter of areas of the sleeve 12 other than the coupling zone 124. In the illustrated preferred embodiment, the coupling zone 123 has an outer diameter smaller than that of the sleeve 12, such that a stepped section 1252 is formed around a joint of the coupling zone 124 with the sleeve 12.

The sleeve 12 is disposed outside the screw 11 and the spring 116 fitted thereon. That is, the screw 11 and the spring 116 are received in the receiving space 123. The sleeve 12 prevents foreign matters from entering into the receiving space 123 and accordingly, ensures that the spring 116 is smoothly compressed or released without abnormal condition.

The spring retaining ring 13 is a disc-like annular member having an inner opening 131 defined at a central area of the spring retaining ring 13. With the inner opening 131, the spring retaining ring 13 can be fitted on or fixed to the coupling zone 124 of the sleeve 12. The stepped section 1252 prevents the spring retaining ring 13 from sliding out of the lower end 122 of the sleeve 12, so that the spring retaining ring 13 is limited to only move axially on and relative to the coupling zone 124.

The spring retaining ring 13 has an upper side surface 13A facing toward the screw head 112, and an annular area of the upper side surface 13A circumferentially extending along a periphery thereof is defined as a peripheral zone 13B. A hooked arm set 132 is upward extended from the upper side surface 13A near or adjoining the inner opening 131 in the direction toward the screw head 12. The hooked arm set 132 includes a plurality of hooked arms 132A, each of which has a fixed end connected to the upper side surface 13A of the spring retaining ring 13 and a free end bent into a hooked end 1321. The hooked ends 1321 respectively have an upper contact surface 13211 and a lower contact surface 13212. Further, the hooked ends 1321 are correspondingly extended through the windows 125 into the receiving space 123 of the sleeve 12 with the lower contact surfaces 13212 pressed on the top end 1161 of the spring 116, so that the spring 116 is held to a compressed state in the sleeve 12. Meanwhile, the upper contact surfaces 13211 of the hooked ends 1321 are pressed against and limited by the upper edges 1251 of the windows 125, so that the spring retaining ring 13 would not move axially upward out of the sleeve 12.

Please refer to FIGS. 4 and 5. The fixing element 1 of the present invention is used to connect a heat dissipation main body 2 to a bare die heat source 3. As shown, the heat dissipation main body 2 has a first side 21, an opposite second side 22, a heat receiving zone 23, and a plurality of through holes 24 extended from the first side 21 to the second side 22. The heat receiving zone 23 is located on the second side 22 of the heat dissipation main body 2; and the through holes 24 are located at four corners outside the heat receiving zone 23.

The fixing element 1 is mounted in each of the four through holes 24 on the heat dissipation main body 2. The bare die heat source 3 is set on a base, and four coupling holes 4 are provided at four corners of the base outside the heat source 3. To connect the heat dissipation main body 2 to the bare die heat source 3, first correspondingly align the four fixing elements 1 on the heat dissipation main body 2 with the four coupling holes 4 on the base and loosely engage the male threads 113 on the fixing elements 1 with female threads in the coupling holes 4, such that the heat receiving zone 23 on the heat dissipation main body 2 is temporarily laid above the bare die heat source 3 and in light contact with the latter. That is, the heat dissipation main body 2 is only preliminarily screwed to the bare die heat source 3, and the bare die heat source 3 is not subjected to any pressure except the weight of the heat dissipation main body 2. For the heat dissipation main body 2 to provide even downward forces to the bare die heat source 3, the springs 116 on the fixing elements 1 mounted to the four corners outside the heat receiving zone 23 must release their spring force synchronously to press down the heat dissipation main body 2 toward the bare die heat source 3.

The springs 116 of the fixing elements 1 can be driven by an external force to release their elastic force synchronously. The external force may be applied manually or by an automated apparatus. In the illustrated preferred embodiment, an automated apparatus is used to apply the external force for triggering the springs 116 to release their elastic force synchronously. However, it is understood the present invention is not limited to the preferred embodiment. The automated apparatus is used with a pressing tool 5 having at least one pressing section 51, which is located corresponding to the fixing elements 1 mounted to the four corners outside the heat receiving zone 23 to push against the annular peripheral zone 13B of the spring retaining ring 13. The pressing section 51 may be a hollow cylindrical structure or include a plurality of downward extended and symmetrically arranged column structures. In the preferred embodiment of the present invention, the pressing section 51 is non-restrictively illustrated as a hollow cylindrical structure, which is not intended to limit the present invention in any way.

When the automated apparatus drives the pressing tool 5 to move downward, all the pressing sections 51 are brought to apply a downward force to the annular peripheral zones 13B of all the spring retaining rings 13 at the same time. A contact area between the outer surface of each sleeve 12 and the inner opening 131 of each corresponding spring retaining ring 13 serves as a rotational fulcrum A. When the pressing tool 5 applies a downward pressure to the annular peripheral zones 13B of the spring retaining rings 13, each of the annular peripheral zones 13B is turned downward about the rotational fulcrum A. At this point, the hooked arms 132A of the corresponding spring retaining rings 13 are brought to a radially and elastically outward expanded state, so that the hooked ends 1321 of the corresponding hooked arms 132A are moved out of the windows 125 relative to the sleeve 2 and no longer press against the top ends 1161 of the corresponding springs 116, allowing the springs 116 to fully release their elastically compressed force. While the top ends 1161 of all the springs 116 are correspondingly pushed against lower end surfaces 1221 of the screw heads 112, the bottom ends 1162 of all the springs 116 also synchronously exert even downward forces to the four corners outside the heat receiving zone 23 on the heat dissipation main body 2, allowing the heat dissipation main body 2 under the synchronous and even downward forces to fitly contact with the bare die heat source 3.

In the present invention, the fixing elements 1 are only preliminarily mounted on the heat dissipation main body 2 to lay the heat dissipation main body 2 to a top of the bare die heat source 3. It is the springs 116 on the screws 11 that actually enable the heat dissipation main body 2 to evenly downward pressed against the bare die heat source 3. That is, in the present invention, all the springs 116 are synchronously released to apply the even downward forces to the heat dissipation main body 2. With the present invention, it is able to solve the problems in the prior art that the conventional screw units C1 are individually screwed one by one to result in uneven force application; or that the screw units C1 are fully tightened in one single movement or excessive pressure is exerted by the springs C2 to result in warped or broken and damaged bare die that is subjected to unevenly applied forces thereto.

In the present invention, the heat dissipation main body 2 can be a vapor chamber, a heat pipe, or a combination of the vapor chamber and the heat pipe. According to an operable embodiment, a plurality of heat pipes (not shown) or at least one radiating fin assembly, or a combination of the heat pipes and the radiating fin assembly can be further provided on the first side 21 of the heat dissipation main body 2, so that the heat dissipation main body 2 can have increased contact areas with air to enhance the heat dissipation efficiency thereof. It is understood the above arrangement is only a non-restrictive example and not intended to limit the present invention in any way.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A fixing element, comprising:
   a screw being provided at a lower end with an annular groove for receiving a retaining ring therein, and having a spring externally fitted thereon;
   a sleeve having an open upper end, an open lower end, and an internal hollow receiving space defined between and communicable with the open upper and lower ends; and including a pair of windows, which are formed on the sleeve near the open upper end thereof and correspondingly located at two opposite positions, the windows respectively having an upper edge and being communicable with the receiving space; and the screw being disposed in the receiving space of the sleeve; and
   a spring retaining ring defining an inner opening for fitting on around an outer surface of the sleeve; the spring retaining ring having an upper side surface, from which a hooked arm set is extended upward; the hooked arm set including a plurality of hooked arms that are extended through the windows into the receiving space to press against a top end of the spring, so that the spring is held down in the sleeve in a compressed state.

2. The fixing element as claimed in claim 1, wherein an area on the outer surface of the sleeve extended from lower edges of the windows to the lower end of the sleeve is defined as a coupling zone; the coupling zone having an outer diameter smaller than that of other areas on the outer surface of the sleeve, such that a stepped section is formed around the sleeve at a joint of the coupling zone with the sleeve; and the stepped section preventing the spring retaining ring from axially moving down out of the coupling zone.

3. The fixing element as claimed in claim 1, wherein the spring retaining ring has an annular peripheral zone defined on the upper side surface to circumferentially extend along a periphery thereof, and the hooked arm set is upward extended from the upper side surface near or adjoining the inner opening; the hooked arms of the hooked arm set respectively having a fixed end connected to the upper side surface of the spring retaining ring and a free end bent into a hooked end.

4. The fixing element as claimed in claim 3, wherein the hooked ends respectively have an upper contact surface and a lower contact surface; the hooked ends being extended through corresponding windows into the receiving space of the sleeve with the lower contact surfaces pressed on the top end of the spring.

5. A heat dissipation unit, comprising a heat dissipation main body having a first side, an opposite second side, a heat receiving zone, and a plurality of through holes formed at four corners outside the heat receiving zone to extend from the first side to the second side; and a plurality of fixing elements being correspondingly mounted in the through holes on the heat dissipation main body; and the fixing elements respectively including:
a screw including an annular groove being formed above an externally threaded lower end that is used to extend through the heat dissipation main body, and a retaining ring being received in the annular groove for stopping a spring externally fitted on around the screw from moving down out of the screw; and the spring having a bottom end pressed against the first side of the heat dissipation main body;
a sleeve having an open upper end, an open lower end, and an internal hollow receiving space defined between and communicable with the open upper and lower ends; the open lower end of the sleeve being abutted on the first side of the heat dissipation main body; and a pair of windows being formed on the sleeve near the open upper end thereof and correspondingly located at two opposite positions to communicate with the receiving space; and the screw being disposed in the receiving space of the sleeve; and
a spring retaining ring defining an inner opening for fitting on around an outer surface of the sleeve; the spring retaining ring having an upper side surface, from which a hooked arm set is extended upward; the hooked arm set including a plurality of hooked arms that are extended through the windows into the receiving space to press against a top end of the spring, so that the spring is held down in the sleeve in a compressed state.

6. The heat dissipation unit as claimed in claim 5, wherein an area on the outer surface of the sleeve extended from lower edges of the windows to the open lower end of the sleeve is defined as a coupling zone; the coupling zone having an outer diameter smaller than that of other areas on the outer surface of the sleeve, such that a stepped section is formed around the sleeve at a joint of the coupling zone with the sleeve; and the stepped section preventing the spring retaining ring from axially moving down out of the coupling zone.

7. The heat dissipation unit as claimed in claim 5, wherein the heat dissipation main body is selected from the group consisting of a vapor chamber, a heat pipe, and a combination of a vapor chamber and a heat pipe.

8. The heat dissipation unit as claimed in claim 5, wherein the spring retaining ring has an annular peripheral zone defined on the upper side surface to circumferentially extend along a periphery thereof and the hooked arm set is upward extended from the upper side surface near or adjoining the inner opening; the hooked arms of the hooked arm set respectively having a fixed end connected to the upper side surface of the spring retaining ring and a free end bent into a hooked end.

9. The heat dissipation unit as claimed in claim 8, wherein the hooked ends respectively have an upper contact surface and a lower contact surface; and the hooked ends being corresponding extended through the windows into the receiving space of the sleeve with the upper contact surface abutted on the upper edges of the windows and the lower contact surfaces pressed on the top end of the spring.

\* \* \* \* \*